(12) United States Patent
Havens et al.

(10) Patent No.: US 6,348,816 B1
(45) Date of Patent: Feb. 19, 2002

(54) TRACKING PERCENT OVERLOAD SIGNAL AS INDICATOR OF OUTPUT SIGNAL MAGNITUDE

(75) Inventors: Joseph H. Havens, Pinckney, MI (US); Bruce W. McNeill, Allentown; Christopher J. Strobel, Barto, both of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/749,722

(22) Filed: Dec. 28, 2000

(51) Int. Cl.[7] .......................... G01R 19/00; H03K 5/153
(52) U.S. Cl. ............................................ 327/58; 327/77
(58) Field of Search ............................... 327/58–62, 72, 327/77, 91

(56) References Cited

U.S. PATENT DOCUMENTS

| | | | | |
|---|---|---|---|---|
| 4,603,299 A | * | 7/1986 | Monett | 327/58 |
| 4,637,003 A | * | 1/1987 | Yokogawa | 327/63 |
| 4,864,167 A | * | 9/1989 | McKibben et al. | 327/58 |
| 5,594,384 A | * | 1/1997 | Carroll et al. | 327/58 |
| 5,629,639 A | * | 5/1997 | Williams | 327/58 |

* cited by examiner

Primary Examiner—Toan Tran

(57) ABSTRACT

Tracking percent overload signal as an indicator of output signal magnitude is achieved by measuring the percent of time the envelope of a varying modulated signal is above a predetermined programmable threshold. The technique is implemented by a level detector including an envelope detector along with circuitry for detecting when the envelope has exceeded the programmable threshold. The output of the level detector is sampled and fed to a counter which provides a digital output which indicates the percentage of time the envelope exceeds the set threshold.

16 Claims, 5 Drawing Sheets

TRACKING PERCENT OVERLOAD SIGNAL AS INDICATOR OF OUTPUT SIGNAL MAGNITUDE

BACKGROUND OF THE INVENTION

1. Field of the Invention

This invention relates generally to the measurement of electrical signals and more particularly to a technique for determining the magnitude of a time varying electrical signal.

2. Description of Related Art

A high frequency signal should not exceed the dynamic range of the system in which the signal is processed. Proper adjustment of the system gain depends upon accurately detecting the level of the signal being processed. Prior art techniques included peak detection of the envelope with a slow decay between peaks. One of the disadvantages of peak detection with slow decay is the rate at which the peak detector must increase to a new peak. It must be quicker than the rate at which the peak detector decays between peaks, however the slower decay rate tends to make an accurate acquisition of sharp peaks more difficult. Another disadvantage of this approach is that it supplies no information about the duration of the peaks.

Another prior art technique relies upon the logarithmic nonlinearity of a diode to convert an ac current into a dc voltage. This technique produces a small dc voltage proportional to the mean of the current squared. One disadvantage of this approach is that the typically small dc output is subject to random device mismatch. Another more significant disadvantage of this and similar approaches is that no information is gained regarding the signal peaks.

SUMMARY

Accordingly, it is the primary object of the present invention to provide a method and apparatus for measuring the magnitude of an electrical signal.

It is another object of the invention to provide an improvement in measuring the magnitude of a high frequency signal.

It is still a further object of the invention to provide a method and apparatus for determining the degree to which the dynamic range of a system has been exceeded.

The foregoing and other objects are achieved by measuring the percent of time the envelope of a varying modulated signal is above a predetermined programmable threshold. The technique is implemented by means of a level detector including an envelope detector along with means for detecting when the envelope has exceeded the programmable threshold. The output of the level detector is sampled and fed to a counter which provides a digital output which indicates the percentage of time the envelope exceeds the set threshold.

Further scope of applicability of the present invention will become apparent from the detailed description provided hereinafter. It should be noted, however, that the detailed description and specific examples, while describing the preferred embodiments of the invention, are provided by way of illustration only, since various changes and modifications coming within the spirit and scope of the invention will become apparent to those skilled in the art from this detailed description.

BRIEF DESCRIPTION OF THE DRAWINGS

The present invention will become more fully understood when the following detailed description is considered in connection with the accompanying drawings which are provided by way of illustration only, and are thus not meant to be limitative of the present invention, and wherein.

DETAILED DESCRIPTION OF THE INVENTION

An envelope detector having a threshold can be used to determine a level of a modulated input signal by measuring the percentage of time the envelope exceeds a predetermined threshold.

Figure 1:
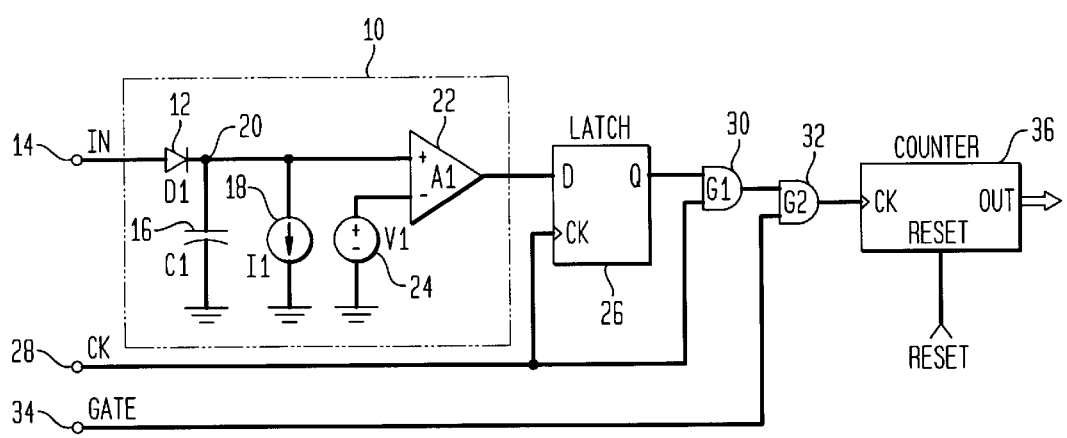
FIG. 1 is an electrical schematic diagram of a first embodiment of the invention.

Considering now the embodiment of the invention shown in FIG. 1, a signal level detector 10 is shown including a diode/capacitor envelope detector including a semiconductor diode 12 connected to an input signal terminal 14. The diode 12 connects to a fixed capacitor 16 which is returned to a point of reference potential, such as ground, and is shunted by a current source 18. The common circuit node 20 between the diode 12 and the capacitor 16 as well as the current source 18 is connected to one input (+) of a differential amplifier 22. The other input (−) is connected to a voltage source 24 which applies a threshold voltage V1 of a predetermined amplitude to the (−) input. In operation, the differential amplifier provides an output when the envelope of the input signal applied to input terminal 14 exceeds the threshold voltage.

Further as shown in FIG. 1, the output of the differential amplifier 22 is sampled by being fed to the (D) input of clocked latch circuit which receives a clock signal CK applied to the CK input of a digital latch circuit 26 in response to a clock signal being applied to terminal 28. When the envelope exceeds the programmable threshold provided by the voltage source 24, an output, typically a binary digital "high" signal, appears at the Q output of the latch 26. A clocked envelope output signal exceeding the threshold V1 appearing at the Q terminal of latch 26 is sequentially coupled to a pair of cascaded AND logic gates 30 and 32. The first logic gate 30 has one input connected to the Q output of the latch 26, while the other input is connected to the clock CK signal applied to terminal 28. The output of the AND gate 30 comprises a clocked output of the latch 26 and is applied to one input of the AND gate 32 whose other input is connected to a gate signal of predetermined time duration applied to a gate input signal terminal 34. The output of the AND gate 32 is applied to the clock input terminal CK of a multi-bit digital counter 36 which outputs a binary digital output signal corresponding to the time the envelope of the input signal is above the threshold voltage V1 during the gate interval.

It has been discovered that the percentage of time the envelope of the input signal exceeds the threshold provides a close estimate of the magnitude of the input signal. For example, if the envelope of the input signal has a bandwidth of 5 MHz, the digital output of the detector can be sampled by the latch 26 once every 4 µs in a 15 ms window (width of gate pulse) when a 250 kHz signal is applied to the clock input terminal 28 and a gate pulse of 15 ms is applied to the gate terminal 34. At the end of a 15 ms window, the final count of the counter when divided by 3750 (15 ms/4 µs) and then multiplied by 100 provides an indication of the percent of the time the signal exceeded the threshold, the percent overload. Sampling 3750 times over a 15 ms window comprises a sufficiently long period to ensure a statistically meaningful sample of a 5 MHz envelope.

The range of input levels over which the detector will provide a reliable indication of the signal level can be extended by either adjusting the threshold level or by adding multiple detectors separated by gain stages.

Figure 2:
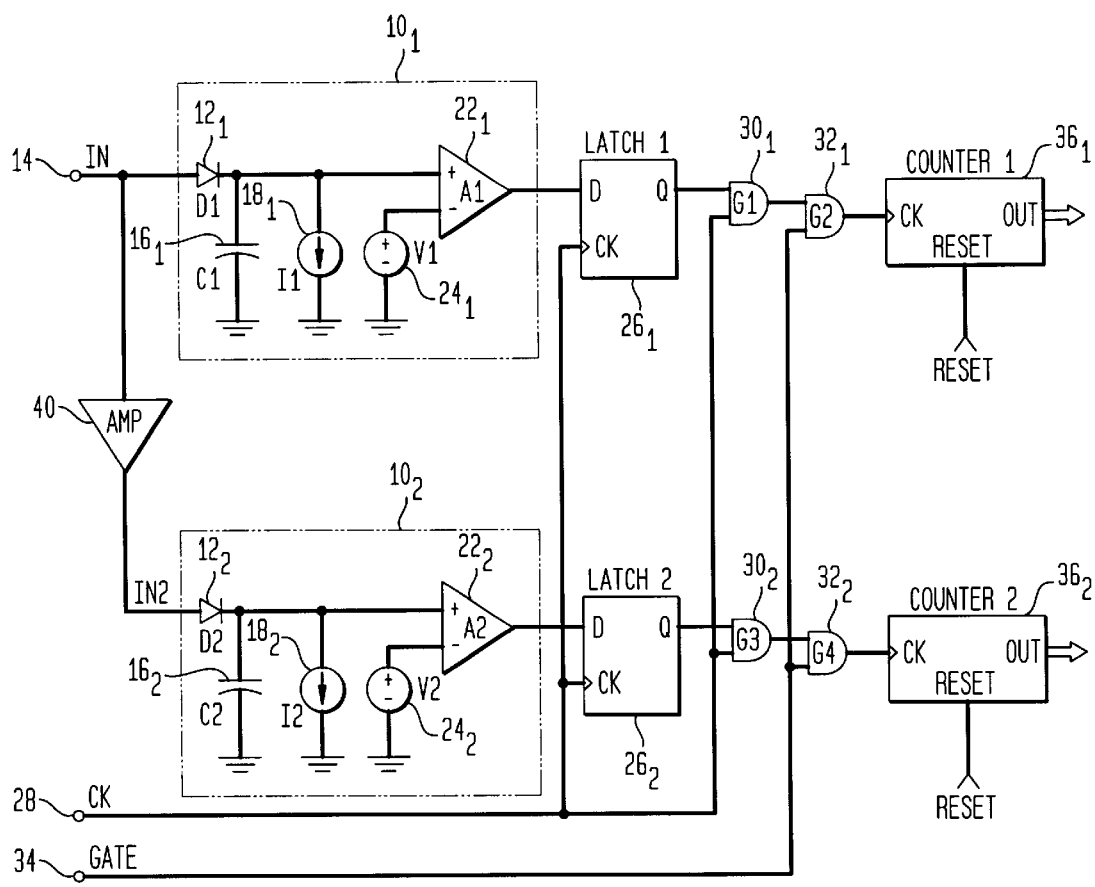
FIG. 2 is an electrical schematic diagram of a second embodiment of the invention.

FIG. 2 is illustrative of how the dynamic range of the detector can be extended using multiple stages. Referring now to FIG. 2, shown thereat are a pair of level detectors $10_1$ and $10_2$; however, an amplifier stage consisting of a fixed-gain amplifier 40 connects an input signal applied to terminal 14 to level detector $10_2$. The components of the second stage are identical to that of the first stage and includes a level detector $10_2$ comprised of diode $12_2$, capacitor $16_2$, current source $18_2$, differential amplifier 22, and a voltage source $24_2$ providing a threshold voltage of V2 which is selectively different from the threshold voltage V1 provided by the voltage source $24_1$ in the first stage. The second stage also includes a latch $26_2$, a pair of AND gates $30_2$ and $32_2$ as well as a digital counter $36_2$. The second stage operates exactly as described above with respect to the first stage.

In the embodiment shown in FIG. 2, the weighted sum of the detectors can be used to determine input signal amplitude over a much wider range than is possible with a single detector. Although this embodiment does not accurately measure the level of an input signal having a constant envelope amplitude, it does permit one to place a bound upon the level, i.e., either lower than the gain A of the amplifier 40 times the second threshold voltage V2, i.e. A×V2, greater than A×V2 but less than the first threshold level V1, or alternatively greater than V1.

The dynamic range can also be extended by adjusting either the gain of amplifier 40 preceding the second level detector $10_2$ or by adjusting the threshold voltage V2. If either of these variables were to be ramped in value during the measurement period, the measurement results would be less sensitive to signal statistics; however, this would allow the system to measure signals having a constant envelope.

Although an embodiment including multiple level detectors such as shown FIG. 2 may appear to be similar to existing piece-wise logarithmic amplifier techniques for level detection, it differs significantly in that the detectors of the subject invention operate in a switched mode, with the input levels substantially larger than the diode thermal voltage, making it temperature insensitive. It also has the advantage of directly producing a digital representation of the signal level, obviating the need for a separate analog-to-digital (A/D) converter.

Figure 3:
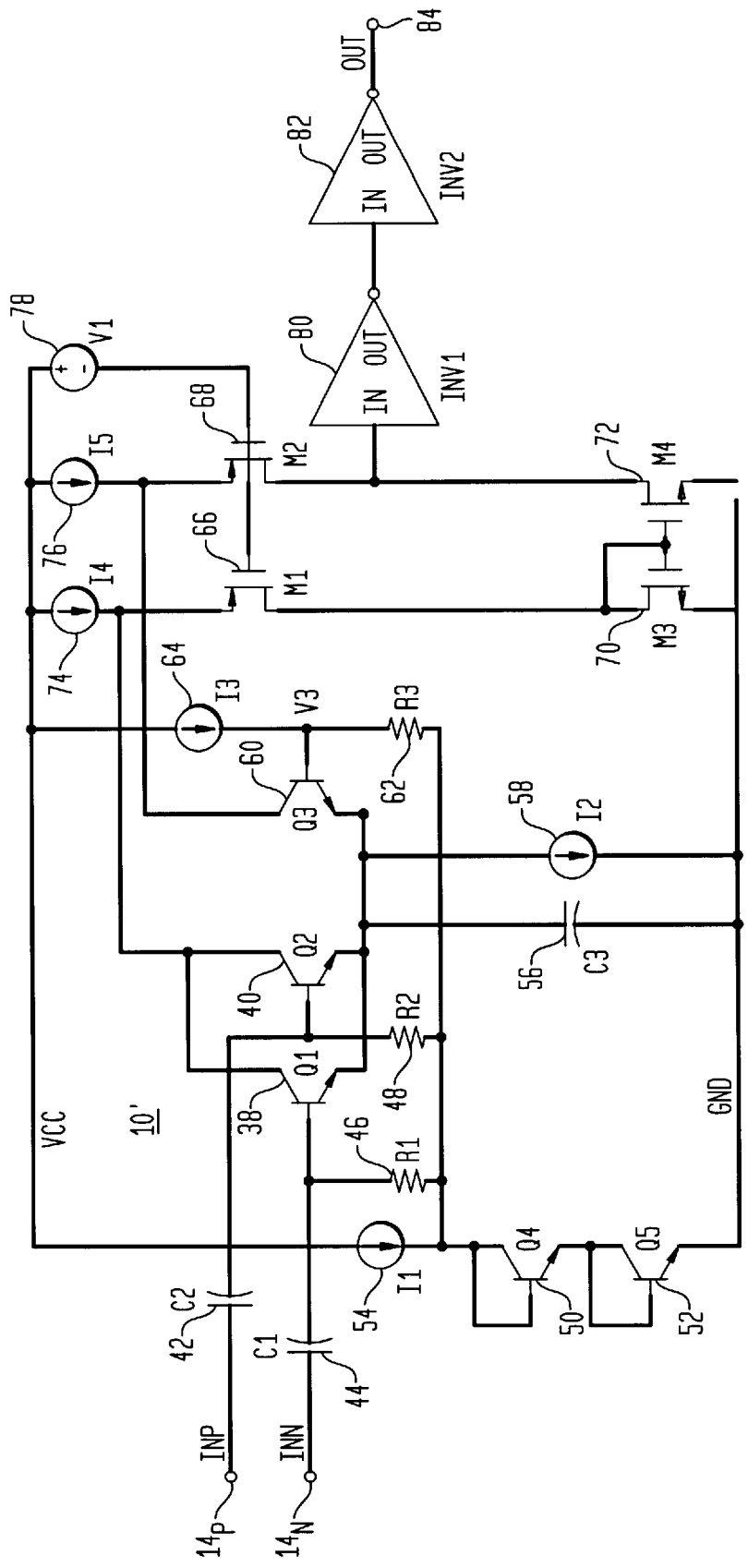
FIG. 3 is an electrical schematic diagram of a transistor implementation of a level detector including envelope detection.

Referring now to FIG. 3, shown thereat is a level detector 10' implemented by means of transistors. As shown, a differential input signal is applied to input signal terminals $14_p$ and $14_n$ where it is coupled to the bases of transistors 38 and 40 via input capacitors 42 and 44 and resistors 46 and 48, which are connected to one side of a pair of transistors 50 and 52 connected to a current source 54. The emitters of transistors 38 and 40 are returned to ground via the capacitor 56 and current source 58. The capacitor 56 in combination with transistors 38 and 40 perform a similar function to the diode 12 shown in FIG. 1 in that the input signal applied across terminals $14_p$ and $14_n$ is rectified such that the voltage at the emitters of transistors 38 and 40 follow the envelope of the input signal; however, a third transistor 60 having a threshold voltage V3 applied to its base prevents the voltage on the emitters of transistors 38 and 40 from following the signal envelope all the way to zero.

The result is that current only flows in transistors 38 and 40 when the envelope of the input signal is greater than the threshold voltage V3 and which is set by the voltage I3R3 drop across resistor 62. Transistors 50 and 52, the current source 54 and the resistors 46, 48 and 62 provide biasing for the input devices consisting of the transistors 38, 40 and 60, and thus implement a differential amplifier with envelope detection. The collector electrodes of transistors 38, 40 and 60 are connected to an active load consisting of MOSFET transistors 66, 68, 70 and 72, a pair of current sources 74 and 76, and the voltage source 78. A pair of high gain signal amplifiers comprising digital inverters 80 and 82 are connected in series between transistors 68 and 72, and operate to convert the difference current between transistors 38 and 40 together with the current of transistor 60 into a signal which is fed, for example, into the latch 26 shown in FIG. 1.

One application for the apparatus shown in FIGS. 1 and 2 is to detect whether a signal level has exceeded the available dynamic range of a system in which the signal is to be input. Present day modulation techniques generally incorporate error correction techniques such that errors caused by momentary interruptions to the signal can be corrected. Accordingly, it is beneficial to have a measure of the degree to which a modulated signal has been compromised due to interruptions caused by exceeding a system's dynamic range. By setting the threshold of the apparatus to correspond to the maximum signal allowed by the system, the value of the digital output will correspond to the degree of signal corruption.

Another application for the apparatus is to detect whether a signal is sufficiently small so as to allow the gain of a system to be safely increased. This measurement could be made with the apparatus shown in FIG. 1 by setting the threshold sufficiently below the maximum allowed by the system. Additionally, the range over which the apparatus is capable of measuring the signal amplitude can be increased by either varying the threshold voltage or using two or more detectors as in FIG. 2.

Figure 4:
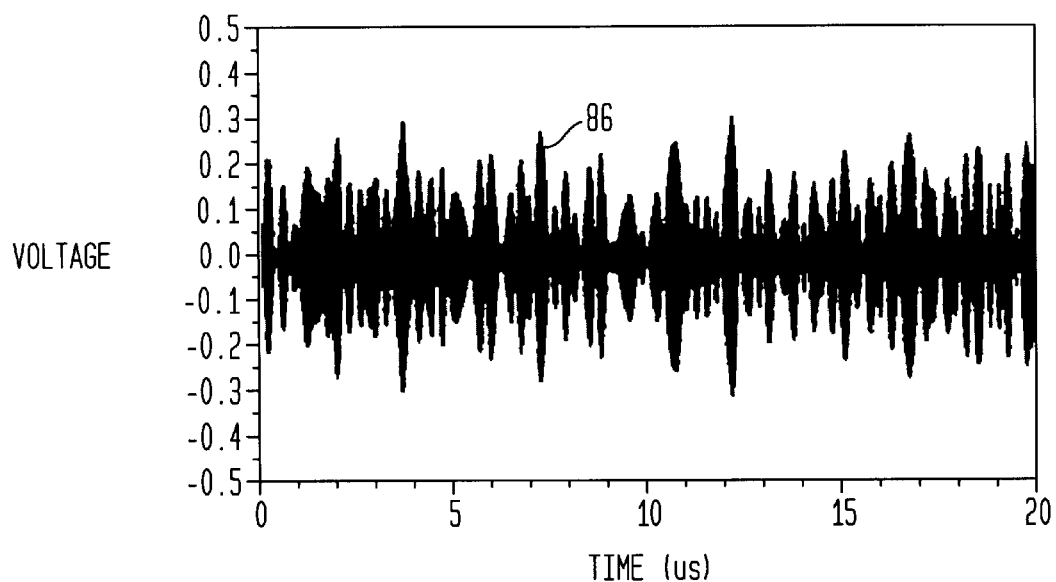
FIG. 4 is an illustration of a modulated signal having an envelope of varying amplitude with time.
Figure 5:
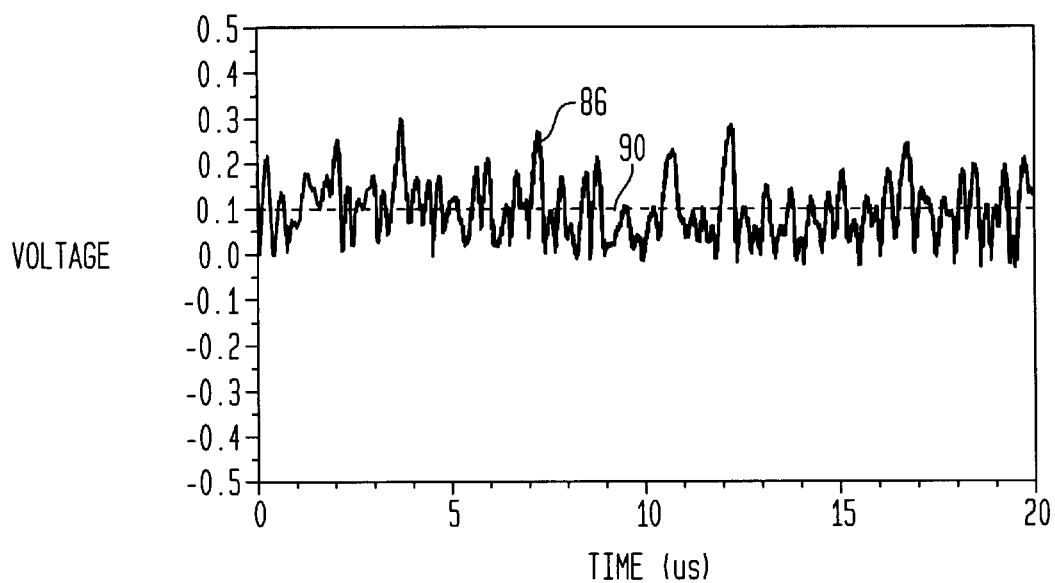
FIG. 5 is illustrative of the modulated signal shown in FIG. 4 following envelope detection.
Figure 6:
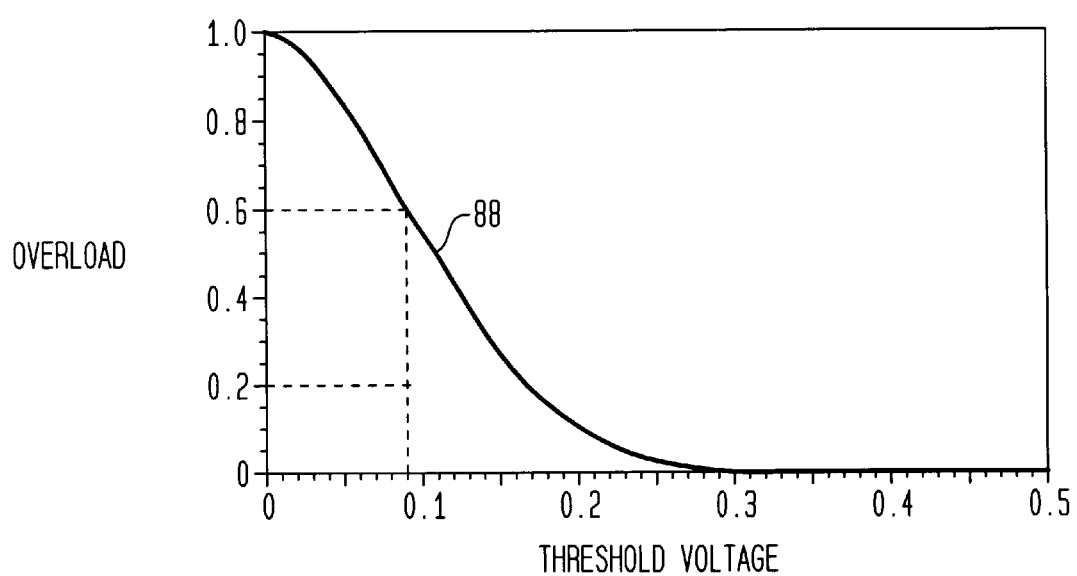
FIG. 6 depicts one method of determining signal magnitude as a function of time in which the signal envelope exceeds a predetermined threshold.

FIGS. 4, 5 and 6 are illustrative of an example of the relationship between signal amplitude and percent overload, i.e., the percentage of time that the envelope exceeds the threshold set in the level detector, for example, as shown in FIG. 1 for the period of the gate signal applied to terminal 34. FIG. 4 depicts a modulated signal shown by reference numeral 86, and having an amplitude varying between +0.3 volts and −0.3 volts (0.1 volts RMS). FIG. 5 discloses the modulated signal 86 following envelope detection and which is limited to 0 volts. The curve 88 shown in FIG. 6 is illustrative of the relationship between threshold voltage and overload. Such a curve can be empirically generated by making suitable measurements with various modulation waveforms. Thus, if the threshold is set at 0.09 volts for a 0.1 volt RMS input signal, one would expect the level detector to indicate a 60% overload. If the threshold remained at 0.09 volts but the level detector indicated only 20% overload, it would indicate that the input signal had an RMS level of 100 mV×(0.09V/0.17V)=53 mV. Thus without changing the threshold voltage, the detector is able to provide a relatively good approximation of input signal amplitude over at least a 15 dB range (Measurements on DQPSK signals having a peak to RMS ratio of 2 were accurate over approximately a 25 dB range. COFDM modulated signals could be measured over approximately a 35 dB range.). This threshold is further indicated by the horizontal broken line shown by reference numeral 90 in FIG. 5 and which would be reflected in the output of the multi-bit digital counter 36 by receiving a digital "high" or "ONE" signal when the envelope 86 is above the threshold level, and a "low" or "ZERO" output when the signal amplitude is below the threshold level 90.

Thus the present invention provides a technique to track the percent of time the overload signal exceeds a threshold as a measure of the actual amplitude of the signal independent of temperature variations of the rectifier. The embodiments of the present invention furthermore provide a digital output directly obviating the need for an analog-to-digital converter.

The foregoing detailed description merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. Apparatus for providing an indication of the magnitude of an electrical signal, comprising:
   an envelope detector connected to an input signal and providing an envelope signal corresponding to the envelope of the input signal;
   a voltage source providing threshold voltage of a selected value;
   a circuit connected to the envelope signal and the threshold voltage and being operable to provide a binary output signal when the envelope signal exceeds the threshold voltage; and
   an output circuit connected to the binary output signal for providing an indication of the percentage of time the binary output signal is high during a predetermined time period or window thereby providing an indication of the magnitude of the input signal.

2. The apparatus as defined by claim 1 wherein the envelope detector comprises a diode having one side connected to an input signal terminal and the other side connected to one side of a capacitor which is returned to a source of reference potential or ground.

3. The apparatus as defined by claim 2 and additionally including a current source shunting the capacitor.

4. The apparatus as defined by claim 2 wherein the circuit which provides the binary output signal comprises a difference circuit.

5. The apparatus as defined by claim 4 wherein the difference circuit comprises a comparator circuit.

6. The apparatus as defined by claim 1 wherein the output circuit includes a sampling circuit for sampling the binary output signal for a predetermined period and a counter for providing a measure of time the binary output signal is high, thereby providing an approximation of the magnitude of the input signal.

7. The apparatus as defined by claim 6 wherein the sampling circuit includes a clocked digital latch circuit.

8. The apparatus as defined by claim 1 and additionally comprising,
   a second envelope detector circuit connected to the input signal,
   a second voltage source providing a second threshold voltage of a selected value,
   a second circuit for providing a second binary output signal when the envelope signal exceeds said second threshold voltage, and,
   a second output circuit connected to said second binary output signal for providing an indication of the percentage of time said second binary output signal is high and thereby providing a further indication of the magnitude of the input signal.

9. The apparatus as defined by claim 8 and additionally including an amplifier circuit having a predetermined gain connecting said input signal to the second envelope detector circuit.

10. The apparatus as defined by claim 1 wherein the envelope detector circuit includes a first transistor element for providing said envelope signal, the circuit connected to the threshold voltage includes a second transistor element for preventing the envelope signal from falling below a predetermined level, and wherein the circuit providing the binary output signal comprises an active load circuit connected to the first and second transistor elements.

11. The apparatus as defined by claim 10 wherein the envelope detector circuit includes a third transistor element coupled to said first transistor element in a differential amplifier configuration for connection to a differential input signal.

12. The apparatus as defined by claim 11 and additionally including a clipping circuit connected to the active load circuit.

13. The apparatus as defined by claim 12 wherein the clipping circuit comprises an inverter.

14. A method of determining the level of an electrical input signal comprising the steps of:
   detecting the envelope of the input signal and generating an envelope signal thereof;
   generating a binary output signal only when the amplitude of the envelope signal exceeds a predetermined threshold level;
   sampling the binary output signal for a predetermined time period; and
   determining the portion of time the binary output signal is high during said time period for providing a measure of the amplitude of the input signal.

15. The method of claim 14 wherein the step of determining comprises determining the percentage of time the binary output signal is high during said time period.

16. The method of claim 15 wherein the step of determining includes providing a digital indication of said percentage of time.

* * * * *